(12) United States Patent
Fang et al.

(10) Patent No.: US 11,094,907 B2
(45) Date of Patent: Aug. 17, 2021

(54) SINGLE PHOTON SOURCE DEVICE, A PREPARATION METHOD THEREOF AND APPLICATIONS OF THE SAME

(71) Applicants: Zhejiang University, Zhejiang (CN); Najing Technology Corporation Limited, Zhejiang (CN)

(72) Inventors: Wei Fang, Zhejiang (CN); Xiaogang Peng, Zhejiang (CN); Yizheng Jin, Zhejiang (CN); Xing Lin, Zhejiang (CN); Xingliang Dai, Zhejiang (CN); Chaodan Pu, Zhejiang (CN)

(73) Assignees: Zhejiang University, Zhejiang (CN); Najing Technology Corporation Limited, Zhejiang (CN)

( * ) Notice: Subject to any disclaimer, the term of this patent is extended or adjusted under 35 U.S.C. 154(b) by 0 days.

(21) Appl. No.: 16/639,735

(22) PCT Filed: Aug. 2, 2018

(86) PCT No.: PCT/CN2018/098222
§ 371 (c)(1),
(2) Date: Feb. 17, 2020

(87) PCT Pub. No.: WO2019/037580
PCT Pub. Date: Feb. 28, 2019

(65) Prior Publication Data
US 2020/0194702 A1 Jun. 18, 2020

(30) Foreign Application Priority Data
Aug. 21, 2017 (CN) .......................... 201710719676.X

(51) Int. Cl.
*H01L 51/50* (2006.01)
*H01L 51/00* (2006.01)
*H01L 51/56* (2006.01)

(52) U.S. Cl.
CPC ........ *H01L 51/502* (2013.01); *H01L 51/0004* (2013.01); *H01L 51/5056* (2013.01); *H01L 51/5076* (2013.01); *H01L 51/5096* (2013.01); *H01L 51/56* (2013.01); *H01L 2251/558* (2013.01)

(58) Field of Classification Search
CPC ............... H01L 51/502; H01L 51/0004; H01L 51/5056; H01L 51/5076
See application file for complete search history.

(56) References Cited

FOREIGN PATENT DOCUMENTS

| CN | 101533770 A | 9/2009 |
|---|---|---|
| CN | 102290435 A | 12/2011 |
| CN | 103904178 A | 7/2014 |
| CN | 105261707 A | 1/2016 |

(Continued)

*Primary Examiner* — Anthony Ho
(74) *Attorney, Agent, or Firm* — Gang Yu

(57) ABSTRACT

The present application provides a single photon source device, a preparation method thereof, and applications of the same. The single photon source device includes a first electrode layer, a first carrier transport layer, a quantum dot light-emitting layer, a second carrier transport layer and a second electrode layer which are stacked in sequence, and the quantum dot light-emitting layer comprises an insulating material and quantum dots dispersed in the insulating material, neighbor distance of at least a part of the quantum dots is greater than or equal to the central wavelength of the luminescent spectrum of quantum dots.

20 Claims, 3 Drawing Sheets

(56) References Cited

FOREIGN PATENT DOCUMENTS

| | | | |
|---|---|---|---|
| CN | 105449112 | A | 3/2016 |
| CN | 106374051 | A | 2/2017 |
| CN | 106384765 | A | 2/2017 |
| CN | 106816539 | A | 6/2017 |
| CN | 107681059 | A | 2/2018 |

SINGLE PHOTON SOURCE DEVICE, A PREPARATION METHOD THEREOF AND APPLICATIONS OF THE SAME

CROSS REFERENCE

This application is a national application of PCT/CN2018098222, filed on Aug. 2, 2018. The contents of PCT/CN2018098222 are all hereby incorporated by reference.

TECHNICAL FIELD

The present invention relates to the field of quantum dot light-emitting technology, in particular to a single photon source device, a preparation method thereof and applications of the same.

BACKGROUND ART

A single photon light source is an atypical light source with statistical characteristics of sub-Poisson photons. The photons are emitted one by one, that is, the photons are anti-bunching. The autocorrelation coefficient $g^{(2)}(0)$ is the most basic characteristic parameter of single photon light source. When $g^{(2)}(0)$ is less than 0.5, it can be considered as single photon category. The value of $g^{(2)}(0)$ can represent the possibility of two or more photons appearing at the same time when the time interval is 0.

Single photon light source (also known as single photon source) has attracted much attention due to a wide range of potential applications thereof. The implementation method of single photon source currently has the following main types: laser attenuation, metallic color center, quantum dots, and spontaneous parametric down conversion. Compared with other methods, quantum dots can be easily integrated into a chip and have advantages in terms of single photon emission quality and light source size. Colloidal quantum dot is a kind of quantum dot for single photon source. Compared with self-assembled quantum dots, colloidal quantum dots can exist without substrates and work at room temperature. The so-called "colloidal" means that semiconductor nanoparticles are dispersed into a continuous solution to form a stable colloidal system.

At the nanoscale, a plurality of physical properties of these nanoparticles will change, and some new properties that semiconductor materials do not have will appear. There are also some advantages, such as: low cost, high quantum efficiency, ability to work at room temperature, solution processable, etc. These advantages mean that colloidal quantum dots have a wide range of potential applications in the field of optoelectronic devices. At present, the autocorrelation coefficient $g^{(2)}(0)$ of an electrically driven single photon source can reach 0.4 after spectral processing, which is not sufficient to be applied to actual products.

SUMMARY

The object of the invention is to provide a single photon source device, a preparation method thereof and applications of the same, solving the problem of high autocorrelation coefficient in electroluminescent single photon light source.

For this purpose, according to one aspect of the present invention, a single photon source device is provided, the single photon source device comprising a first electrode layer, a first carrier transport layer, a quantum dot light-emitting layer, and a second carrier transport layer and a second electrode layer which are stacked in sequence, wherein the quantum dot light-emitting layer comprises an insulating material and quantum dots dispersed in the insulating material, neighbor distance of at least a part of the quantum dots is greater than or equal to the central wavelength of the luminescent spectrum of the quantum dots.

Further, the quantum dot light-emitting layer has a thickness of h, and the quantum dots have an average particle diameter of d, with d<h<2d.

Further, the shortest distance between at least a part of the quantum dots in the quantum dot light-emitting layer and the second carrier transport layer is 1 to 4 nm, preferably 2 to 3 nm, at least a part of the quantum dots in the quantum dot light-emitting layer being in direct contact with the first carrier transport layer, the first carrier transport layer being a hole transport layer, and the second carrier transport layer being an electron transport layer.

Further, bandgap of the insulating material is at least 2 eV greater than bandgap of the quantum dots, and preferably, the bandgap of the insulating material is not less than 4 eV.

Further, a distribution density of the quantum dots in the quantum dot light-emitting layer is less than or equal to 0.1 quantum dot per square micron.

Further, the insulating material is a polymer, preferably being selected from one or more of the group consisting of polymethyl methacrylate, polyvinyl chloride, poly-α-methylstyrene resin, polybutylene terephthalate, polypropylene carbonate, and polystyrene.

Further, the material of the second carrier is an inorganic oxide or a doped inorganic oxide, the inorganic oxide being selected from any one or more of the group consisting of ZnO, $TiO_2$, SnO, $ZrO_2$ and $Ta_2O_3$, and the dopant in the doped inorganic oxide being selected from one or more of the group consisting of Li, Mg, Al, Cd, In, Cu, Cs, Ga, Gd, and 8-hydroxyquinoline aluminum, with the doping ratio of the dopant equal to 0.001 to 50% by weight.

Further, the material of the first carrier is selected from one or more of the group consisting of poly(3,4-ethylenedioxythiophene)-poly(styrenesulfonate), polythienothiophene: poly(perfluoroethylene-perfluoroethersulfonic acid), nickel oxide, tungsten oxide, molybdenum oxide, chromium oxide, vanadium oxide, p-type gallium nitride, $MoS_2$, $WS_2$, $WSe_2$, $MoSe_2$, poly[N,N'-bis(4-butylphenyl)-N,N'-bis(phenyl)benzidine], poly[(9,9-dioctylfluorenyl-2,7-diyl)-co-(4,4'-(N-(4-sec-butylphenyl)diphenylamine)], poly (9-vinylcarbazole), poly(9,9-di-n-octylfluorenyl-2,7-diyl), 2,3,5,6-Tetrafluoro-7,7,8,8-tetracyanoquinodimethane, poly (9,9-di-n-octylfluorenyl-2,7-diyl)-alt-(benzo[2,1,3]thiadiazol-4,8-diyl)], 4,4'-bis(9-carbazole)biphenyl, 4,4',4"-tris (carbazol-9-yl)triphenylamine, N,N'-diphenyl-N,N'-(1-naphthyl)-1,1'-biphenyl-4,4'-diamine, N,N'-bis-(1-naphthyl)-N,N'-diphenyl-1,1'-biphenyl-4,4'-diamine, 4-butylphenyl-diphenylamine and N,N'-bis(3-methylphenyl)-N,N'-bis(phenyl)-9,9-spirobifluorene.

Further, the single photon source device has an autocorrelation coefficient $g^{(2)}(0)$ being less than or equal to 0.1, preferably 0.04 to 0.05, as measured by the Hanbury-Brown-Twiss method.

Further, a threshold voltage of the single photon source device is less than or equal to 3V.

Further, when the numerical aperture of the collecting objective lens is equal to 1.46, the number of single photons of the single photon source device received per second is $10^3 \sim 10^5$.

According to another aspect of the present invention, a preparation method of a single photon source device is further provided, the preparation method comprising: step S1, providing a first electrode layer on the substrate; step S2, providing a first carrier transport layer on one surface of the first electrode layer far away from the substrate; step S3, providing a quantum dot light-emitting layer on one surface of the first carrier transport layer far away from the first electrode layer; step S4, providing a second carrier transport layer on one surface of the quantum dot light-emitting layer far away from the first carrier transport layer; and step S5, providing a second electrode layer on one surface of the second carrier transport layer far away from the quantum dot light-emitting layer, wherein, the step S3 includes: providing raw materials of the quantum dot light-emitting layer on the first carrier transport layer by a solution method, raw materials of the quantum dot light-emitting layer comprising a quantum dot solution and a liquid insulating material; drying the raw materials of the quantum dot light-emitting layer to obtain the quantum dot light-emitting layer.

Further, the step S3 comprising: providing the quantum dot solution on the first carrier transport layer by a solution method to form a quantum dot solution layer; providing the liquid insulating material on the quantum dot solution layer by a solution method to form the raw materials of a quantum dot light-emitting layer including the quantum dot solution and the liquid insulating material; and drying the raw materials of the quantum dot light-emitting layer to obtain the quantum dot light-emitting layer; or the step S3 comprising: mixing the quantum dot solution and the liquid insulating material to form a mixture; providing the mixture on the first carrier transport layer by a solution method; and drying the mixture to obtain the quantum dot light-emitting layer; or the step S3 comprising:

mixing the quantum dot solution with the liquid insulating material having a first concentration form a first mixture; providing the first mixture on the first carrier transport layer by a solution method to form a first mixture layer; providing the insulating material having a second concentration on the first mixture layer to form the raw materials of the quantum dot light-emitting layer comprising the quantum dot solution and the liquid insulating material; wherein the first concentration is less than the second concentration; drying the raw material of the quantum dot light-emitting layer to obtain the quantum dot light-emitting layer.

Further, the solution method is selected from any one of the group consisting of inkjet printing, slit coating, spin coating and spray coating.

According to another aspect of the present invention, a quantum communication system is provided, the quantum communication system comprising a single photon source device, wherein the single photon source device is a single photon source device of any one of aforesaid single photon source device.

According to another aspect of the present invention, a quantum metering system is provided, the quantum metering system comprising a single photon source device, wherein the single photon source device is a single photon source device of any one of aforesaid single photon source device.

According to another aspect of the present invention, a quantum computing system is provided, the quantum computing system comprising a single photon source device, wherein the single photon source device is a single photon source device of any one of aforesaid single photon source device.

The hole transport rate is slow relative to the electron transport rate due to the limited choice of the existing carrier (including electron and hole) transport materials, the insulating material disposed in the quantum dot light-emitting layer may balance the injection of electrons and holes on both sides of the quantum dot light-emitting layer based on the insulating property of the insulating material. At the same time, in the application scenario of the single photon source device, the insulating material blocks electrons and prevents electrons from directly entering the adjacent hole transport layer through the quantum dot light-emitting layer. And if the electrons are not blocked, a background noise (undesirable light) emerges because electrons are recombined in the hole transport layer to emit light, which affects the single photon effect, while the present application increases a barrier level for electrons passing through by providing the insulating material in the quantum dot light-emitting layer, and thus ensures the single photon emission effect of quantum dots, thereby further reducing the auto-correlation coefficient of the single photon source device. The neighbor distance of at least a part of the quantum dots is greater than or equal to the central wavelength of the luminescent spectrum of quantum dots, which is the minimum theoretical requirement for realizing single photon light source. If the neighbor distance between quantum dots is too small, emission of adjacent quantum dots will interfere with the collection of single photon of each quantum dot afterwards. The neighbor distance of each quantum dot can be adjusted by controlling the concentration of the quantum dots in the quantum dot light-emitting layer, so that the spacing between the quantum dots can be made larger than or equal to the central wavelength of the light-emitting spectrum of the quantum dots.

BRIEF DESCRIPTION OF THE DRAWINGS

The accompanying figures of the specification that form part of the application are used to provide a further understanding of the present invention, and the illustrative embodiments of the present invention and the description thereof are intended to explain the present invention and are not intended to limit the present invention. In the figures.

Figure 1:
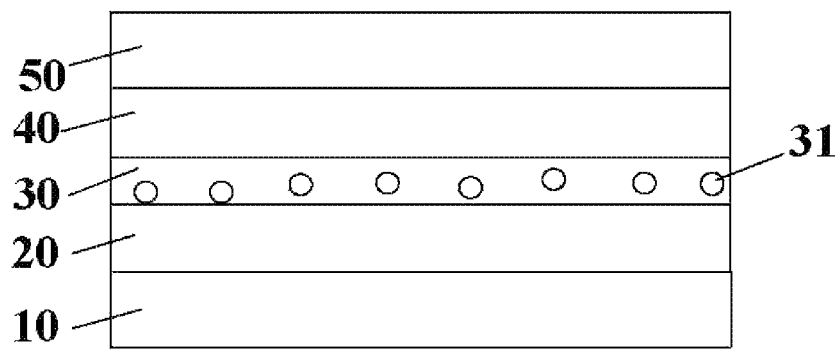
FIG. 1 shows the structural diagram of a single photon source device provided by a preferred embodiment of the present application.

Wherein, the aforesaid figures include the following reference numerals:

10, first electrode layer; 20, first carrier transport layer; 30, quantum dot light-emitting layer; 31, quantum dots; 40, second carrier transport layer; 50, second electrode layer.

DETAILED DESCRIPTION

It should be noted that the embodiments in the present application and the features in the embodiments may be combined with each other without conflict. The present invention will be described in detail below with reference to the accompanying figures and in conjunction with the embodiments.

As analyzed by the background art of the present application, the autocorrelation coefficient $g^{(2)}(0)$ of the single photon source device in the prior art can reach 0.4 after spectral processing, but the autocorrelation coefficient is still too high to be applied to actual products. In order to solve the problem, in a typical embodiment of the present application, a single photon source device is provided, and as shown in FIG. 1, the single photon source device includes: a first electrode layer 10, a first carrier transport layer 20, a quantum dot light-emitting layer 30, a second carrier transport layer 40 and a second electrode layer 50 which are stacked in sequence, wherein, the quantum dot light-emitting layer 30 comprises an insulating material and quantum dots 31 dispersed in the insulating material, neighbor distance of at least a part of the quantum dots 31 is greater than or equal to the central wavelength of the luminescent spectrum of quantum dots 31.

The hole transport rate is slow relative to the electron transport rate due to the limited choice of the existing carrier (including electron and hole) transport materials, the insulating material disposed in the quantum dot light-emitting layer 30 may balance the injection of electrons and holes from both sides of the quantum dot light-emitting layer 30 based on the insulating property of the insulating material. At the same time, in the application scenario of the single photon source device, the insulating material blocks electrons and prevents electrons from directly entering the adjacent hole transport layer through the quantum dot light-emitting layer 30. And if the electrons are not blocked, a background noise (i.e., undesirable photons occur) emerges because electrons are recombined in the hole transport layer to emit light, which affects the single photon effect, while the present application increases a barrier level for electrons passing through by providing the insulating material in the quantum dot light-emitting layer 30 and thus ensures the single photon emission effect of quantum dots 31, thereby further reducing the autocorrelation coefficient of the single photon source device. The neighbor distance of at least a part of the quantum dots 31 is greater than or equal to the central wavelength of the luminescent spectrum of quantum dots 31 (Each quantum dot in the quantum dot light-emitting layer 30 is colloidal quantum dot, preferably all of the quantum dots having the same properties or high monodispersity prepared in the same batch), which is the minimum theoretical requirement for realizing single photon light source. If the neighbor distance between quantum dots is too small, emission of adjacent quantum dots will interfere with the collection of single photon from each quantum dot afterwards, so at least a part of the quantum dots 31 shall satisfy such distance restriction. It can be noted that the quantum dots with single photo emission can be targeted during collection phase for single photo collection. The neighbor distance of each of the aforesaid quantum dots 31 can be adjusted by controlling the concentration of the quantum dots 31 in the quantum dot light-emitting layer 30, so that the spacing between the quantum dots 31 can be made larger than or equal to the central wavelength of the light-emitting spectrum of the quantum dots 31. Neighbor distance means the distance between two adjacent quantum dots.

In some preferred embodiments of the present application, the quantum dot light-emitting layer 30 has a thickness of h, and the quantum dots 31 have an average particle diameter of d, with d<h<2d. By controlling the thickness of the quantum dot light-emitting layer 30, the thickness of the quantum dot light-emitting layer 30 is smaller than the arrangement of two quantum dots (i.e., twice of the average particle diameter), thereby increasing the possibility of single quantum dot arrangement in the quantum dot light-emitting layer 30 in the thickness direction, and reducing stacking, because stacking of multiple quantum dots may simultaneously generate more than one photon, thus reducing the collection efficiency of single photons.

In some preferred embodiments of the present application, the shortest distance between at least a part of the quantum dots 31 in the quantum dot light-emitting layer 30 and the second carrier transport layer 40 is 1 to 4 nm, preferably 2 to 3 nm, and at least a part of the quantum dots 31 in the quantum dot light-emitting layer 30 are in direct contact with the first carrier transport layer 20, the first carrier transport layer 20 being a hole transport layer, and the second carrier transport layer 40 being an electron transport layer. Through the aforesaid arrangement, the holes may be further accurately controlled to enter the quantum dot light-emitting layer 30 in time; and the distance of electrons passing through the quantum dot light-emitting layer 30 is increased so as to prolong the time of electron transport.

In order to effectively reduce the direct electronic coupling of the second carrier layer 40 and the quantum dot light-emitting layer 30, and regulate the carrier injection barrier between the second carrier layer and the quantum dot light-emitting layer 30, the bandgap of the insulating material is preferably at least 2 eV greater than the bandgap of the quantum dots 31, and the bandgap of the insulating material is preferably not less than 4 eV. In addition, since the quantum dots 31 in the layer of the quantum dots 31 generally have organic surface ligands, in order to further enhance the uniformity of dispersion of the quantum dots 31 in the insulating material, the insulating material is preferably a polymer, and the insulating material is more preferably being selected from one or more of the group consisting of polymethyl methacrylate, polyvinyl chloride, poly-α-methylstyrene resin, polybutylene terephthalate, polypropylene carbonate, and polystyrene.

Furthermore, in order to ensure the presence of more single photons, the distribution density of the aforesaid quantum dots 31 in the quantum dot light-emitting layer 30 is preferably less than or equal to 0.1 quantum dot per square micron. It can be calculated by counting the number of quantum dots per square micron by a microscope.

The quantum dots in the quantum dot light-emitting layer of the present application may be selected from any one or more of the group consisting of red quantum dots, green quantum dots, and blue quantum dots, and the number of quantum dots may be adjusted according to performance requirements of the device.

In some embodiments, the quantum dots in the light-emitting layer may be infrared quantum dots, and their central wavelength of the light-emitting spectrum covers the near-infrared band (780-2526 nm), preferably the central wavelength is near 850 nm, or near 1300 nm, or near 1550 nm. These three wavelengths are three commonly used windows in optical fiber communication, among which the signal loss in 1550 nm window is the least.

In order to improve stability of the quantum dots in the quantum dot light-emitting layer, preferably, the aforesaid quantum dot light-emitting layer further includes quantum dot ligands. Wherein, the quantum dot ligands known to those skilled in the art are generally organic ligands, such as sulfhydryl ligands, phosphate ligands or carboxylate ligands, preferably sulfhydryl ligands, and thus in the process of fabricating quantum dot light-emitting layers, quantum dot ligands are used to stably disperse quantum dots in organic solvent, and quantum dot ligands can bond with atoms exposed on the surface of the quantum dots, thereby modifying the defect level of the quantum dot surface; and the bonding force between quantum dots and quantum dot ligands is relatively stronger, thereby effectively protecting the quantum dots. It should be clear to those skilled in the art that the surface ligands of quantum dots are introduced during synthesis, type of ligand may more than one, the number of various ligands is uncertain, and the ligands may fall off during the purification process of the quantum dots. Therefore, replacement of the ligands having stronger coordination with the quantum dots by ligand exchange will pull down the ligands originally having weaker coordination, and finally only a single type of ligand having strong coordination remains, the coordination of the single type of ligand may be beneficial to repeated preparation of the light-emitting devices. Use of the aforesaid ligands may refer to cooperative utilization of ligands and quantum dots in the prior art.

The aforesaid first electrode layer and second electrode layer are respectively selected from an anode and a cathode, and the material forming the aforesaid anode is selected one or more from the group consisting of glass/indium tin oxide (ITO), fluorine doped tin oxide (FTO), indium zinc oxide (IZO), aluminum doped zinc oxide, gallium doped zinc oxide, cadmium doped zinc oxide, copper indium oxide (ICO), tin oxide ($SnO_2$), zirconia, graphene, carbon nanotubes, nickel, gold, platinum, and palladium. The anode layer requires a suitable thickness. On the one hand, if the anode layer is ultra thin, the conductivity will be very poor, which is not suitable for the electrode. On the other hand, if the anode is too thick, the efficiency of light extraction will be affected, and the cost will be increased. Depending on the thickness of the other layers, preferably, the thickness of the anode is 5 to 1000 nm, more preferably 150 to 300 nm. The material forming the aforesaid cathode is selected from one or more of the group consisting of Al, LiF/Al, Ca, Ba, Ca/Al, Ag, LiF/Ag, Ca/Ag, $BaF_2$, $BaF_2$/Al, $BaF_2$/Ag, $BaF_2$/Ca/Al, $BaF_2$/Ca/Ag, Mg, Ag: Mg, CsF/Al, and $CsCO_3$/Al, wherein, LiF/Al represents a composite cathode combined by a LiF layer and an Al layer, and Ag: Mg represents that Ag and Mg form a cathode in the same layer. The thickness of the cathode preferably satisfies the requirements for light transmittance. The thickness of the aforesaid cathode 6 is preferably 5 to 1000 nm, more preferably 100 to 200 nm.

In some embodiments of the present application, the material of the aforesaid second carrier is an inorganic oxide or a doped inorganic oxide, and the inorganic oxide is selected from one or more of the group consisting of ZnO, $TiO_2$, SnO, $ZrO_2$, and $Ta_2O_3$, while the dopant in the doped inorganic oxide is selected from one or more of the group consisting of Li, Mg, Al, Cd, In, Cu, Cs, Ga, Gd, and 8-hydroxyquinoline aluminum, and the doping ratio of the dopant is 0.001 to 50% by weight.

The material forming the first carrier transport layer 20 of the present invention may be a conventional material, wherein, preferably the material of the first carrier is selected from at least one of the group consisting of poly(3,4-ethylenedioxythiophene)-poly(styrenesulfonate), polythienothiophene: poly(perfluoroethylene-perfluoroethersulfonic acid), nickel oxide, tungsten oxide, molybdenum oxide, chromium oxide, vanadium oxide, p-type gallium nitride, MoS2, $WS_2$, $WSe_2$, $MoSe_2$, poly[N,N'-bis(4-butylphenyl)-N,N'-bis(phenyl)benzidine], poly[(9,9-dioctylfluorenyl-2,7-diyl)-co-(4,4'-(N-(4-sec-butylphenyl)diphenylamine)], poly(9-vinylcarbazole), poly(9,9-di-n-octylfluorenyl-2,7-diyl), 2,3,5,6-Tetrafluoro-7,7,8,8-tetracyanoquinodimethane, poly(9,9-di-n-octylfluorenyl-2,7-diyl)-alt-(benzo[2,1,3]thiadiazol-4,8-diyl)], 4,4'-bis(9-carbazole)biphenyl, 4,4',4"-tris(carbazol-9-yl)triphenylamine, N,N'-diphenyl-N,N'-(1-naphthyl)-1,1'-biphenyl-4,4'-diamine, N, N'-bis-(1-naphthyl)-N,N'-diphenyl-1,1'-biphenyl-4,4'-diamine, 4-butylphenyl-diphenylamine and N,N'-bis(3-methylphenyl)-N,N'-bis(phenyl)-9,9-spirobifluorene.

In some preferred embodiments of the present application, as measured by the Hanbury-Brown-Twiss method, the autocorrelation coefficient $g^{(2)}(0)$ of the aforesaid single photon source device is less than or equal to 0.1, preferably 0.04 to 0.05, which is greatly reduced compared with the single photon source device in the prior art. In addition, the threshold voltage of the single photon source device of the present application is 3V or less, preferably 1.8~3V, and the lower threshold voltage enables the single photon source device of the present application to be started by a common battery, which expands the application scenario.

Further, when the numerical aperture of the collecting objective lens is equal to 1.46, the number of single photons of the single photon source device received per second is $10^3 \sim 10^5$, indicating that the single photon effect of the single photon source device of the present application is particularly prominent.

In another exemplary embodiment of the present application, there is provided a preparation method of any one of the aforesaid single photon source devices, the preparation method comprising: step S1, providing a first electrode layer 10 on the substrate; step S2, providing a first carrier transport layer 20 on one surface of the first electrode layer 10 far away from the substrate; step S3, providing a quantum dot light-emitting layer 30 on one surface of the first carrier transport layer 20 far away from the first electrode layer 10; step S4, providing a second carrier transport layer 40 on one surface of the quantum dot light-emitting layer 30 far away from the first carrier transport layer 20; and step S5, providing a second electrode layer 50 on one surface of the second carrier transport layer 40 far away from the quantum dot light-emitting layer 30; the aforesaid step S3 includes: providing raw materials of the quantum dot light-emitting layer 30 on the first carrier transport layer 20 by a solution method, raw materials of the quantum dot light-emitting layer 30 comprising a quantum dot solution and a liquid insulating material; drying the raw materials of the quantum dot light-emitting layer 30 to obtain the quantum dot light-emitting layer 30. The quantum dot solution and the liquid insulating material are provided on the first carrier transport layer 20, which facilitates dispersion of the quantum dots 31 in the insulating material and adjustment of the concentration of the quantum dots 31. The liquid insulating material may include insulating material and solvent.

The remaining steps (except step S3) may also be carried out by firstly performing solution processing to deposit relevant materials and then drying.

The aforesaid solution method may be a solution method commonly used in the art, preferably any one of the group consisting of inkjet printing, slit coating, spin coating, and spray coating. The aforesaid solution method at different steps may be the same or different, therefore the solution method at different step may also be distinguished by definition with the expression of "the first", "the second", "the third", "the fourth" and "the fifth", and so on.

Step S3 of the present application may be implemented in various ways. The main consideration is how to better control the distance between the quantum dots 31 in the quantum dot light-emitting layer 30 and the second carrier transport layer 40. In a preferred implementation, the aforesaid step S3 includes: providing the quantum dot solution on the first carrier transport layer 20 by a solution method to form a quantum dot solution layer; providing the liquid insulating material on the quantum dot solution layer by a solution method to form the raw materials of a quantum dot light-emitting layer 30 including the quantum dot solution and the liquid insulating material; and drying the raw materials of the quantum dot light-emitting layer 30 to obtain the quantum dot light-emitting layer 30.

First, a quantum dot solution is provided on the first carrier transport layer 20, and the number of quantum dots used is controlled by adjusting the concentration of the quantum dot solution; then the liquid insulating material is provided on the provided quantum dot solution, and after the drying is completed, the solvent in the quantum dot solution is volatilized, and the insulating material is filled into the gaps between the quantum dots 31, so that the quantum dots 31 of the formed quantum dot light-emitting layer 30 can be in direct contact with the first carrier transport layer 20, while having a certain distance away from the second carrier transport layer 40, and the distance between the quantum dots 31 and the second carrier transport layer 40 can be adjusted by controlling the thickness of the liquid insulating material provided.

In other preferred embodiments, the aforesaid step S3 comprising: mixing the quantum dot solution and the liquid insulating material to form a mixture; providing the mixture on the first carrier transport layer 20 by a solution method; and drying the mixture to obtain the quantum dot light-emitting layer 30.

In still other preferred embodiments, the aforesaid step S3 comprising: mixing the quantum dot solution with the liquid insulating material having a first concentration to form a first mixture; providing the first mixture on the first carrier transport layer 20 by a solution method to form a first mixture layer; providing the liquid insulating material having a second concentration on the first mixture layer to form the raw materials of the quantum dot light-emitting layer 30 comprising the quantum dot solution and the liquid insulating material; and drying the raw material of the quantum dot light-emitting layer 30 to obtain the quantum dot light-emitting layer 30, wherein, the first concentration is less than the second concentration; and the viscosity is low due to the low first concentration, so that the quantum dots are better dispersed in the preparation process. The position of the quantum dots 31 is better controlled in this embodiment, in comparison with the quantum dot light-emitting layer 30 obtained by the second embodiment.

In still another exemplary embodiment of the present application, there is provided with a quantum communication system, or a quantum metering system, or a quantum computing system, including a single photon source device, which is any one of the aforesaid single photon source devices. Since the single photon source device of the present application has good performance of single photon, the data transmission efficiency and accuracy of the quantum communication system, the quantum metering system, and the quantum computing system to which the single photon source device is applied can be improved.

Advantageous effects of the present application will be further described below in conjunction with the embodiments and comparative embodiments.

The synthesis method of CdSe/CdS core-shell quantum dots used in the following embodiments and comparative embodiments:

Synthesis of CdSe core quantum dots with the first exciton peak at 550 nm: 0.2 mmol of cadmium stearate and 3.5 mL of octadecene (ODE) were placed in a 25 mL three-necked flask, and after bubbling with argon, Se suspension (0.05 mmol Se dispersed in 0.5 mL ODE) was injected into the aforesaid three-necked flask at 250° C. After 8 minutes of growth, the Se suspension was added multiple times until the first exciton peak reached 550 nm. Then, the reaction system in the three-necked flask was cooled to 50° C., and then the unreacted precursors and by-products were removed by in-situ purification to obtain a CdSe quantum dot core solution.

Growth of CdS shell: a mixture of 1.2 mL dodecane, 3.8 mL oleylamine, 1 mL CdSe quantum dot core solution (containing about $3\times10^{-7}$ mol quantum dot core) was heated to 80° C., then cadmium diethyldithiocarbamate (Cd precursor) was added to the mixture of 80° C. and the temperature was raised to 160° C. to grow the shell. The growth time of the first monolayer was 40 minutes, while the growth time of each remaining monolayers was 20 minutes, and the aforesaid temperature cycle (80 to 160° C.) was suitable for the growth of all monolayers, and the injection volumes of the Cd precursor solution for each monolayer growth were 0.08 mL, 0.11 mL, 0.15 mL, 0.20 mL, 0.26 mL, 0.32 mL, 0.39 mL, 0.46 mL, 0.54 mL and 0.63 mL, respectively. In the growth of the first to sixth monolayer, cadmium diethyldithiocarbamate was the sole Cd precursor. Starting from the seventh monolayer, Cd precursor became a mixture of cadmium diethyldithiocarbamate and cadmium oleate (the molar ratio of the two was 4:1). Upon completion of growth of the shell layer, the quantum dots in the obtained product system were precipitated with ethanol, and the precipitated quantum dots were redispersed in a mixture of octane and 2-ethyl-1-hexanethiol (with molar ratio of 1:1) for ligand exchange. After 1 hour, the core-shell quantum dots were precipitated with ethanol and redispersed in octane to obtain CdSe/CdS core-shell quantum dots having an average particle diameter of 10 nm.

Embodiment 1

A glass substrate was prepared, ITO was spin-coated onto the glass substrate to form a first electrode layer, with an ITO thickness of 0.18 mm and a sheet resistance of ~100 Ω/sq. The hole injection material PEDOT: PSS solution (BaytronP VP Al 4083, filtered through a 0.45 mm N66 filter) was spin-coated at 4000 rpm for 50 s onto ITO, and baked at 150° C. for 15 minutes to form a hole injection layer having a thickness of 30 nm. The glass substrate provided with the hole injection layer was transferred to a nitrogen-filled glove box ($O_2$<1 ppm, $H_2O$<1 ppm), and 8 mg/mL Poly-TPD as the hole transport material was spin-coated at 2000 rpm for 45 s and baked at 130° C. for 30 minutes to obtain a hole transport layer with a thickness of 30 nm. A mixture of an octane solution of quantum dots and an acetone solution of PMMA (1.0 mg/mL) was spin-coated at 2000 rpm for 45 s and dried to form a 12 nm quantum dot light-emitting layer, and an original octane solution of quantum dots (with the optical density OD value at 400 nm was 1.0) was diluted 50,000 times to obtain the octane solution of quantum dots; the ethanol solution of ZnO nanoparticles (concentration of ~40 mg/mL) as the second carrier material was spin-coated at 2000 rpm for 45 s, and after drying, an electron transport layer having a thickness of 50 nm was obtained. The silver electrode (100 nm) was vapor-deposited under $2*10^{-7}$ torr in a thermal evaporator (Trovato 300C), and finally the cover plate was placed, and an ultraviolet curing adhesive was used for curing and encapsulation.

Embodiment 2

A glass substrate is prepared, ITO was spin-coated onto the glass substrate to form a first electrode layer, with an ITO thickness of 0.18 mm and a sheet resistance of ~100 Ω/sq. The hole injection material PEDOT: PSS solution (BaytronP VP Al 4083, filtered through a 0.45 mm N66 filter) was spin-coated at 4000 rpm for 50 s onto ITO, and baked at 150° C. for 15 minutes to form a hole injection layer having a thickness of 30 nm. The glass substrate provided with the hole injection layer was transferred to a nitrogen-filled glove box ($O_2$<1 ppm, $H_2O$<1 ppm), and 8 mg/mL Poly-TPD as the hole transport material was spin-coated at 2000 rpm for 45 s and baked at 130° C. for 30 minutes to obtain a hole transport layer with a thickness of 30 nm. A mixture of an octane solution of quantum dots and an acetone solution of PMMA (1.0 mg/mL) was spin-coated at 2000 rpm for 45 s and dried to form a 10.4 nm quantum dot light-emitting layer, and an orginal octane solution of quantum dots (with the optical density OD value at 400 nm was 1.0) was diluted 50,000 times to obtain the octane solution of quantum dots; the ethanol solution of ZnO nanoparticles (having an average particle diameter of 50 nm, concentration of 40 mg/mL) as the second carrier material was spin-coated at 2000 rpm for 45 s, and after drying, an electron transport layer having a thickness of 50 nm was obtained. The silver electrode having a thickness of 100 nm was vapor-deposited under $2*10^{-7}$ torr in the thermal evaporator (Trovato 300C), and finally the cover plate was placed, and the ultraviolet curing adhesive was used for curing and encapsulation.

Embodiment 3

A glass substrate was prepared, ITO was spin-coated onto the glass substrate to form a first electrode layer, with an ITO thickness of 0.18 mm and a sheet resistance of ~100 Ω/sq. The hole injection material PEDOT: PSS solution (BaytronP VP Al 4083, filtered through a 0.45 mm N66 filter) was spin-coated at 4000 rpm for 50 s onto ITO, and baked at 150° C. for 15 minutes to form a hole injection layer having a thickness of 30 nm. The glass substrate provided with the hole injection layer was transferred to a nitrogen-filled glove box ($O_2$<1 ppm, $H_2O$<1 ppm), and 8 mg/mL Poly-TPD as the hole transport material was spin-coated at 2000 rpm for 45 s and baked at 130° C. for 30 minutes to obtain a hole transport layer with a thickness of 30 nm. A mixture of an octane solution of quantum dots and an acetone solution of PMMA (1.0 mg/mL) was spin-coated at 2000 rpm for 45 s and dried to form a 17 nm quantum dot light-emitting layer, and an orginal octane solution of quantum dots (with the optical density OD value at 400 nm was 1.0) was diluted 50,000 times to obtain the octane solution of quantum dots; the ethanol solution of ZnO nanoparticles (having an average particle diameter of 50 nm, concentration of 40 mg/mL) as the second carrier material was spin-coated at 2000 rpm for 45 s, and after drying, an electron transport layer having a thickness of 50 nm was obtained. The silver electrode having a thickness of 100 nm was vapor-deposited under $2*10^{-7}$ torr in the thermal evaporator (Trovato 300C), and finally the cover plate was placed, and the ultraviolet curing adhesive was used for curing and encapsulation.

Comparative Embodiment 1

A glass substrate was prepared, ITO was spin-coated onto the glass substrate to form a first electrode layer, with an ITO thickness of 0.18 mm and a sheet resistance of ~100 Ω/sq. The hole injection material PEDOT: PSS solution (BaytronP VP Al 4083, filtered through a 0.45 mm N66 filter) was spin-coated at 4000 rpm for 50 s onto ITO, and baked at 150° C. for 15 minutes to form a hole injection layer having a thickness of 30 nm. The glass substrate provided with the hole injection layer was transferred to a nitrogen-filled glove box ($O_2$<1 ppm, $H_2O$<1 ppm), and 8 mg/mL Poly-TPD as the hole transport material was spin-coated at 2000 rpm for 45 s and baked at 130° C. for 30 minutes to obtain a hole transport layer with a thickness of 30 nm. An octane solution of quantum dots was spin-coated at 2000 rpm for 45 s and the spin-coated octane solution was dried to form a quantum dot light-emitting layer of 12 nm thickness, and an orginal octane solution of quantum dots (with the optical density OD value at 400 nm was 1.0) was diluted 50,000 times to obtain the aforesaid octane solution of quantum dots; the ethanol solution of ZnO nanoparticles (having an average particle diameter of 50 nm, concentration of 40 mg/mL) as the second carrier material was spin-coated at 2000 rpm for 45 s, and after drying, an electron transport layer having a thickness of 50 nm was obtained. The silver electrode having a thickness of 100 nm was vapor-deposited under $2*10^{-7}$ torr in a thermal evaporator (Trovato 300C), and finally the cover plate was placed, and the ultraviolet curing adhesive was used for curing and encapsulation.

The electroluminescent spectra of the single photon source device obtained in each of the aforesaid embodiments and comparative embodiment were characterized by a fluorescence microscope system. The single photon source device was put on an XYZ stage, a piezoelectric element for accurate control and a DC power source (Keithley 2400) for electroluminescence were used, the emitted light of quantum dots was collected using an oil immersion objective with an N.R. of 1.46, the photon correlation measurements was performed using a single photon counting module (PicoHarp 300) with a 50:50 splitter (ie, the Hanbury-Brown-Twiss method), and the luminescent spectra were record using a spectrometer (Andor Shamrock 303i). All of the aforesaid tests were carried out at room temperature of 20 to 22° C. and under atmospheric pressure. The test results were recorded in FIGS. 2 to 6. The spectra of FIGS. 2 to 3 show an average results tested over an area of about 1 mm² by a fiber optic spectrometer (Ocean Optics, QEPro).

Figure 2:
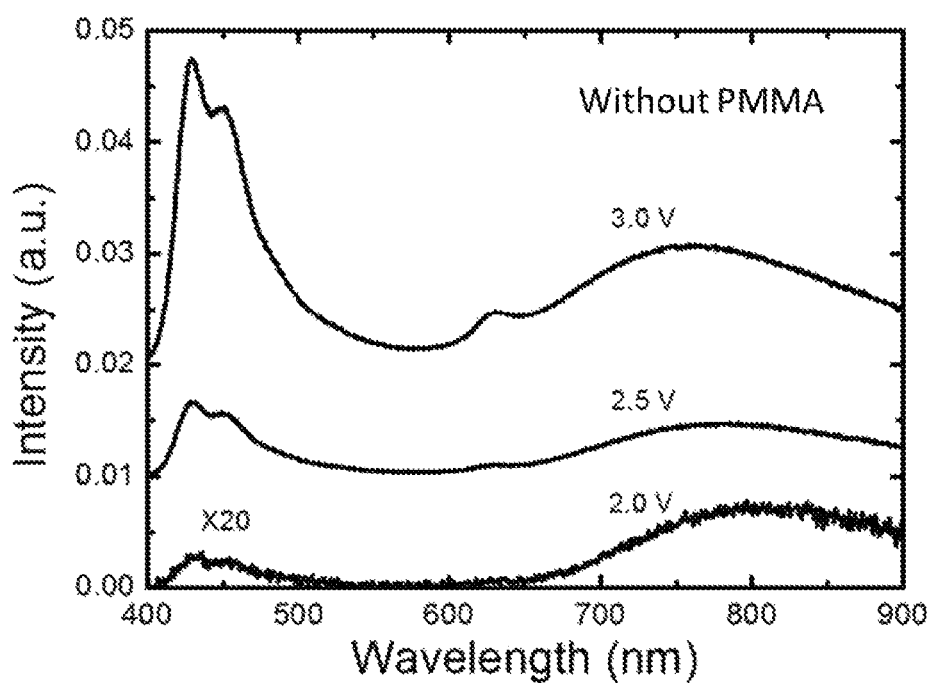
FIG. 2 shows the results of electroluminescent spectrum of the single photon source device of Comparative Embodiment 1 at different voltages.

Wherein, FIG. 2 shows the electroluminescent spectrum result of the single photon source device of Comparative Embodiment 1 at different voltages. It can be seen from FIG. 2 that there is background light at 400~500 nm, and the higher the voltage is, the more obvious the phenomenon becomes.

Figure 3:
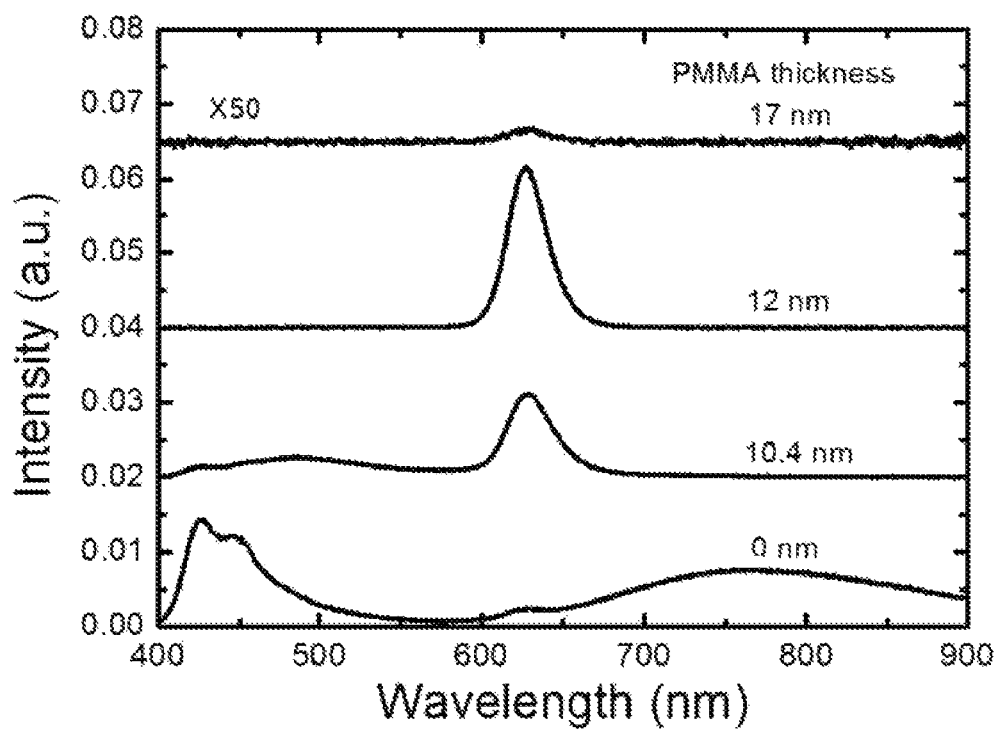
FIG. 3 shows the results of electroluminescent spectrum of the single photon source devices of Embodiments 1 to 3 and Comparative Embodiment 1 at a voltage of 2.8 V.

FIG. 3 shows the electroluminescent spectrum results of the single photon source devices of Embodiments 1 to 3 and Comparative Embodiment 1 at voltage of 2.8 V, and it can be seen from FIG. 3 that Comparative Embodiment 1 has background light at 400 to 500 nm, while Embodiments 1 to 3 (corresponding to the spectral curves of 10.4 nm, 12 nm, and 17 nm respectively) have no background light, and the spectrum of Embodiment 3 is a 50-fold amplified spectrum.

Figure 4:
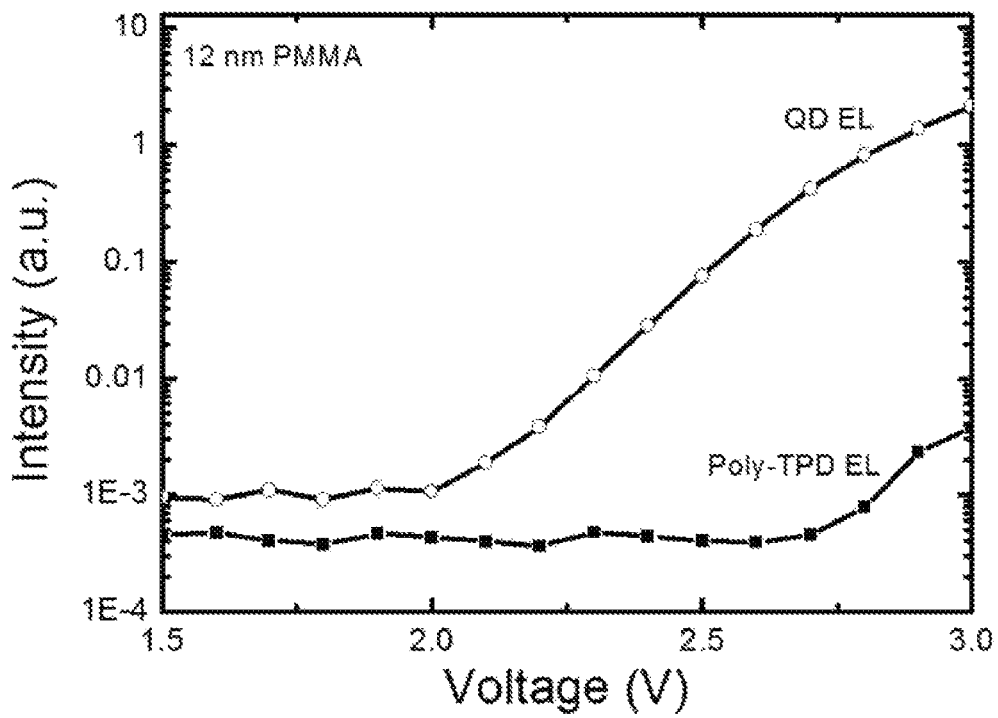
FIG. 4 shows the results of electroluminescent intensity measurement of the quantum dots (in the range of 600 to 660 nm) and Poly-TPD (in the range of 400 to 500 nm) in Embodiment 1 with the variation of voltage.

FIG. 4 shows the results of electroluminescent intensity measurement of the quantum dots (in the range of 600 to 660 nm) and Poly-TPD (in the range of 400 to 500 nm) in Embodiment 1 with the variation of voltage. As can be seen from FIG. 4, the hole transport layer (Poly-TPD EL shown in FIG. 4) has a weak luminescence, that is, the intensity of background interference light is low.

Figure 5:
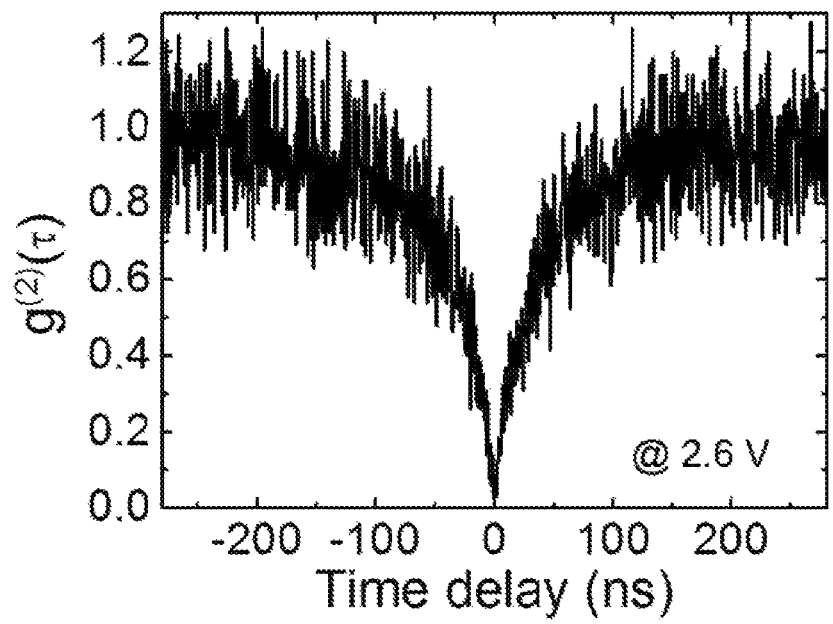
FIG. 5 shows the $g^{(2)}(\tau)$ curve of electroluminescence of the single photon source device of Embodiment 1 at a voltage of 2.6 V.

FIG. 5 shows the $g^{(2)}(\tau)$ curve of electroluminescence of the single photon source device of Embodiment 1 at a voltage of 2.6 V. As can be seen from FIG. 5, the value of $g^{(2)}(0)$ is close to 0, so the single photon effect is good.

Figure 6:
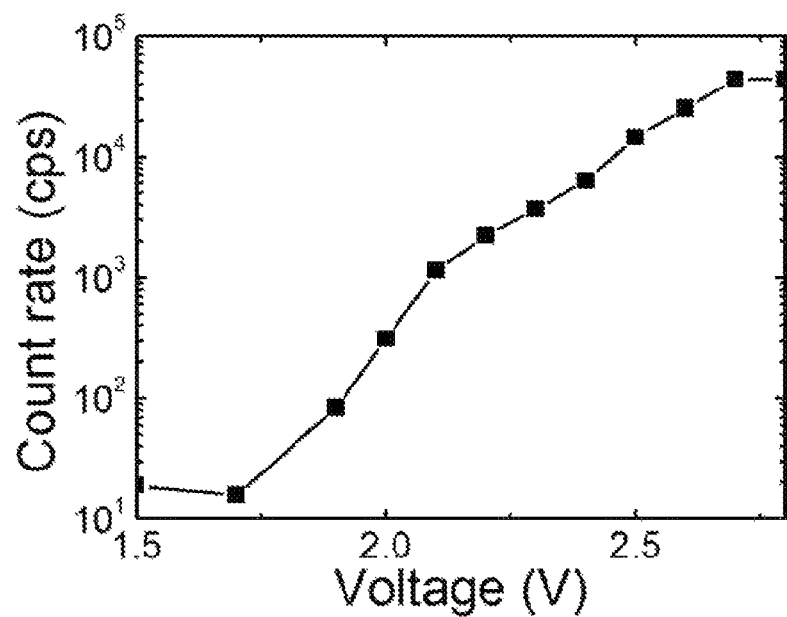
FIG. 6 shows the statistical curve of photon number of the single photon source device of Embodiment 1 at different voltages.

FIG. 6 shows the statistical curve of photon number of the single photon source device of Embodiment 1 at different voltages. According to FIG. 6, it can be seen that the count rate of single photons is $10^2 \sim 10^5$, indicating that the number of effective single photons is large, and the counts per second is equal to the count rate.

From the above description, it can be seen that the aforesaid embodiments of the present disclosure achieve the following technical effects.

The hole transport rate is slow relative to the electron transport rate due to the limited choice of the existing carrier (including electron and hole) transport materials, the insulating material disposed in the quantum dot light-emitting layer may balance the injection of electrons and holes from both sides of the quantum dot light-emitting layer based on the insulating property of the insulating material. At the same time, in the application scenario of the single photon source device, the insulating material blocks electrons and prevents electrons from directly entering the adjacent hole transport layer through the quantum dot light-emitting layer. And if the electrons are not blocked, a background noise (undesirable light) emerges because electrons are recombined in the hole transport layer to emit light, which affects the single photon effect, while the present application increases a barrier level for electrons passing through by providing the insulating material in the quantum dot light-emitting layer, and thus ensures the single photon emission effect of quantum dots, thereby further reducing the autocorrelation coefficient of the single photon source device. The neighbor distance of at least a part of the quantum dots is greater than or equal to the central wavelength of the luminescent spectrum of quantum dots, which is the minimum theoretical requirement for realizing single photon light source. If the neighbor distance between quantum dots is too small, emission of adjacent quantum dots will interfere with the collection of single photon of each quantum dot afterwards. It can be noted that the quantum dots with single photo emission can be targeted during collection phase for single photo collection. The neighbor distance of each quantum dot can be adjusted by controlling the concentration of the quantum dots in the quantum dot light-emitting layer, so that the spacing between the quantum dots can be made larger than or equal to the central wavelength of the light-emitting spectrum of the quantum dots.

The above are only the preferable embodiments of the invention, and not intended to limit the invention, it is to be noted by those skilled in the art that the invention may has various modifications and variations. Any modifications, equivalent replacements, improvements and the like made within the sprint and principle of the invention shall fall within the scope of protection of the invention.

What is claimed is:

1. A single photon source device, comprising a first electrode layer, a first carrier transport layer, a quantum dot light-emitting layer, and a second carrier transport layer and a second electrode layer which are stacked in sequence, wherein said quantum dot light-emitting layer comprises an insulating material and quantum dots dispersed in said insulating material, neighbor distance of at least a part of said quantum dots is greater than or equal to the central wavelength of the luminescent spectrum of said quantum dots.

2. The single photon source device according to claim 1, wherein said quantum dot light-emitting layer has a thickness of h, and said quantum dots have an average particle diameter of d, with d<h<2d.

3. The single photon source device according to claim 2, wherein the shortest distance between at least a part of said quantum dots in said quantum dot light-emitting layer and said, second carrier transport layer 1 to 4 nm.

4. The single photon source device according to claim 2, wherein at least a part of said quantum dots in said quantum dot light-emitting later being in direct contact with said first carrier transport layer, said first carrier transport layer being a hole transport later, and said second carrier transport later being an electron transport later.

5. The single photon source device according to claim 1, wherein, a bandgap of said insulating material is at least 2 eV greater than a bandgap of said quantum dots.

6. The single photon source device according to claim 1, wherein a distribution density of said quantum dots in said quantum dot light-emitting layer is less than or equal to 0.1 quantum dot per square micron.

7. The single photon source device according to claim 1, wherein said insulating material is selected from one or more of the group consisting of polymethyl methacrylate, polyvinyl chloride, poly-α-methylstyrene resin, polybutylene terephthalate, polypropylene carbonate, and polystyrene.

8. The single photon source device according to claim 1, wherein the material of said second carrier is an inorganic oxide or a doped inorganic oxide, said inorganic oxide being selected from any one or more of the group consisting of $ZnO$, $TiO_2$, $SnO$, $ZrO_2$ and $Ta_2O_3$, and the dopant in said doped inorganic oxide being selected from one or more of the group consisting of Li, Mg, Al, Cd, In, Cu, Cs, Ga, Gd, and 8-hydroxyquinoline aluminum, with the doping ratio of said dopant equal to 0.001 to 50% by weight.

9. The single photon source device according to claim 1, wherein the material of said first carrier is selected from one or more of the group consisting of poly(3,4-ethylenedioxythiophene)-poly(styrenesulfonate), polythienothiophene: poly(perfluoroethylene-perfluoroethersulfonic acid), nickel oxide, tungsten oxide, molybdenum oxide, chromium oxide, vanadium oxide, p-type gallium nitride, $MoS_2$, $WS_2$, $WSe_2$, $MoSe_2$ poly[N,N'-bis(4-butylphenyl)-N,N'-bis(phenyl)benzidine], poly[(9,9-dioctylfluorenyl-2,7-diyl)-co-(4,4'-(N-(4-sec-butylphenyl)diphenylamine)], poly(9-vinylcarbazole), poly(9,9-di-n-octylfluorenyl-2,7-diyl), 2,3,5,6-Tetrafluoro-7,7,8,8-tetracyanoquinodimethane, poly(9,9-di-n-octylfluorenyl-2,7-diyl)-alt-(benzo[2,1,3]thiadiazol-4,8-diyl)], 4,4'-bis(9-carbazole)biphenyl, 4,4',4''-tris(carbazol-9-yl) triphenylamine, N,N'-diphenyl-N,N'-(1-naphthyl)-1,1'-biphenyl-4,4'-diamine, N,N'-bis-(1-naphthyl)-N,N'-diphenyl-1,1'-biphenyl-4,4'-diamine, 4-butylphenyl-diphenylamine and N,N'-bis(3-methylphenyl)-N,N'-bis(phenyl)-9,9-spirobifluorene.

10. The single photon source device according to claim 1, wherein said single photon source device has an autocorrelation coefficient $g^{(2)}(0)$ being less than or equal to 0.1 as measured by the Hanbury-Brown-Twiss method.

11. The single photon source device according to claim 1, wherein a threshold voltage of said single photon source device is less than or equal to 3V.

12. The single photon source device according to claim 1, wherein when the numerical aperture of the collecting objective lens is equal to 1.46, the number of single photons of said single photon source device received per second is $10^3 \sim 10^5$.

13. A preparation method of a single photon source device according to claim 1, wherein said preparation method comprising:
- step S1, providing a first electrode layer on the substrate;
- step S2, providing a first carrier transport layer on one surface of said first electrode layer far away from the substrate;
- step S3, providing a quantum dot light-emitting layer on one surface of said first carrier transport layer far away from said first electrode layer;
- step S4, providing a second carrier transport layer on one surface of said quantum dot light-emitting layer far away from said first carrier transport layer; and
- step S5, providing a second electrode layer on one surface of said second carrier transport layer far away from said quantum dot light-emitting layer, wherein, said step S3 comprising:
- providing raw materials of the quantum dot light-emitting layer on said first carrier transport layer by a solution method, raw materials of said quantum dot light-emitting layer comprising a quantum dot solution and a liquid insulating material;
- drying the raw materials of said quantum dot light-emitting layer to obtain said quantum dot light-emitting layer.

14. The preparation method according to claim 13, wherein said step S3 comprising:
- providing said quantum dot solution on said first carrier transport layer by a solution method to form a quantum dot solution layer;
- providing said liquid insulating material on said quantum dot solution layer by a solution method to form the raw materials of a quantum dot light-emitting layer comprising said quantum dot solution and said liquid insulating material; and
- drying the raw materials of said quantum dot light-emitting layer to obtain said quantum dot light-emitting layer;
- or said step S3 comprising:
- mixing said quantum dot solution and said liquid insulating material to form a mixture;
- providing said mixture on said first carrier transport layer by a solution method; and
- drying said mixture to obtain said quantum dot light-emitting layer;
- or said step S3 comprising:
- mixing said quantum dot solution with said liquid insulating material having a first concentration form a first mixture;
- providing said first mixture on said first carrier transport layer by a solution method to form a first mixture layer;
- providing said liquid insulating material having a second concentration on said first mixture layer to form the raw materials of the quantum dot light-emitting layer comprising said quantum dot solution and said liquid insulating material; wherein said first concentration is less than said second concentration;
- drying the raw material of said quantum dot light-emitting layer to obtain said quantum dot light-emitting layer.

15. The preparation method according to claim 13, wherein said solution method is selected from any one of the group consisting of inkjet printing, slit coating, spin coating, and spray coating.

16. A quantum communication system comprising a single photon source device, wherein said single photon source device is a single photon source device of claim 1.

17. A quantum metering system comprising a single photon source device, wherein said single photon source device is a single photon source device of claim 1.

18. A quantum computing system comprising a single photon source device, wherein said single photon source device is a single photon source device of claim 1.

19. The single photon source device according to claim 1, wherein the bandgap of said insulating material is not less than 4 eV.

20. The single photon source device according to claim 1, said single photon source device has an autocorrelation coefficient $g^{(2)}(0)$ being 0.04 to 0.05 as measured by the Hanbury-Brown-Twiss method.

* * * * *